(12) United States Patent
Nishioka et al.

(10) Patent No.: US 6,204,638 B1
(45) Date of Patent: Mar. 20, 2001

(54) METHOD FOR CHARGING CAPACITOR

(75) Inventors: Yoshinao Nishioka, Shiga; Toshinari Tabata, Otsu, both of (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/003,263

(22) Filed: Jan. 6, 1998

(30) Foreign Application Priority Data

Jan. 6, 1997 (JP) ........................................ 9-12021

(51) Int. Cl.⁷ .................................................. H01M 10/46
(52) U.S. Cl. ........................... 320/139; 320/160; 320/166
(58) Field of Search ................................. 320/130, 139, 320/141, 145, 160, 166, FOR 100, FOR 120, FOR 121, FOR 122, FOR 138

(56) References Cited

U.S. PATENT DOCUMENTS

| 4,149,533 |   | 4/1979  | Ishikawa et al. .................. 128/172.1 |
| 4,284,944 | * | 8/1981  | Iwanaga et al. ...................... 320/139 |
| 5,262,729 |   | 11/1993 | Kawabata et al. .................... 324/548 |
| 5,617,007 | * | 4/1997  | Keidl et al. ........................... 320/141 |
| 5,646,506 | * | 7/1997  | Suzuki ............................. 320/141 X |
| 5,659,239 | * | 8/1997  | Sanchez et al. ................. 320/160 X |
| 5,694,023 | * | 12/1997 | Podrazhansky et al. ........ 320/145 X |

FOREIGN PATENT DOCUMENTS

| 4254769 | 9/1992 | (JP) . |
| 9113545 | 5/1997 | (JP) . |

* cited by examiner

*Primary Examiner*—Edward H. Tso
(74) *Attorney, Agent, or Firm*—Ostrolenk, Faber, Gerb & Soffen, LLP

(57) ABSTRACT

A capacitor can be charged at a high speed by applying a direct current voltage intermittently to the capacitor. The direct current voltage is intermittently applied to the capacitor such that a preceding applied voltage $E_1$ is larger than a succeeding applied voltage $E_2$. Thus, the charging is swiftly progresses and the capacitor can be charged at a higher speed than when the voltage is applied continuously.

5 Claims, 6 Drawing Sheets

METHOD FOR CHARGING CAPACITOR

BACKGROUND OF THE INVENTION

1. Field of the Invention

The present invention relates to a method of charging a capacitor for use in measurement of insultation resistance of a capacitor, for determination of the quality or failure rate or the like.

2. Description of the Related Art

Generally, in order to determine the quality or failure rate of a capacitor, there is known a method where a direct current measurement voltage is applied to a capacitor and a leakage current (charge current) of the capacitor is measured after the capacitor has been sufficiently charged, by which the insulation resistance of the capacitor is measured. Naturally, an excellent product is provided with small leakage current.

Conventionally, as a method of measuring insulation resistance of this kind, there is known a measurement system prescribed in JIS (Japanese Industrial Standards)-C 5102. According to this system, a measurement time period of substantially 60 seconds is needed since it is necessary to measure a current value after a capacitor has been sufficiently charged. However, in order to reduce the cost and improve the reliability of electronic devices, improvements in production capacity and quality are required also in an electronic part such as a capacitor or the like and therefore, these requirements cannot be met at all by the conventional measuring method where such a long measurement time period is needed for one capacitor.

For charging a capacitor, a method of continuously applying direct current voltage as well as a method of intermittently applying direct current voltage (Japanese Unexamined Patent Publication No. JP-A-4-254769) are known. This method is suitable in the case where characteristic measurement is performed by using a turntable that is intermittently fed and is capable of performing characteristic measurement continuously in respect of a number of capacitors supplied from a parts feeder. In order to measure insulation resistance by using such a turntable, it is possible to use either a continuous system, in which the insulation resistance is measured in respect of capacitors which have finished charging after passing through a plurality of charging regions one by one, or a batch system where charging and measurement of insulation resistance are simultaneously carried out in respect of a plurality of capacitors by stopping a turntable after supplying a predetermined number of capacitors to the turntable. However, a long period of time is needed for charging in either of these systems and their charging efficiency is not excellent.

However, as a result of an intensive study of intermittent application of direct current voltage to a capacitor, the inventors have found that even intermittent application has an effect similar to that of continuous application under certain conditions. That is, intermittent application provides charging characteristics similar to those of continuous application and charging progresses even if there are moments where voltage application is interrupted, as long as they are short time periods.

FIG. 1 and FIG. 2 are graphs showing accurately measured changes of current value, when direct current voltage is continuously applied to a ceramic capacitor, and when it is intermittently applied, respectively, logarithmic current value being plotted against time. In the case of continuous application, as shown by FIG. 1, a substantially constant large current flows during a very small time period (1) after a time $t_0$ of starting application of a voltage $E_0$. However, the current value is rapidly lowered successively during a transient time period (2) and thereafter, the current value is lowered with a linear charging characteristic (3) having an inclination. The linear charging characteristic (3) continues until about 1 to 2 minutes has elapsed since the start of charging.

In the case of intermittent application, as shown by FIG. 2, the characteristics (1),(2) and (3) are initially quite similar to those in the case of continuous application. Thereafter, a voltage $E_0$ is applied a second time at time $t_b$ after voltage application is interrupted once at time $t_a$. Although the current value is initially increased rapidly as shown by a curve (4), thereafter, the current value is rapidly lowered and is stabilized to a linear charging characteristic (5). Although the characteristic at the top of the curve (4) is not clearly shown, since the abscissa of FIG. 2 designates logarithmic time, the top portion is actually constituted by a horizontal portion similar to (1) and a transient period similar to (2). Further, it is found that the linear characteristic (5) is on a line extended from the linear charging characteristic (3) of the initial voltage application. Even when the intermittent application of voltage is repeated thereafter, characteristics similar to the above-described curves (4) and (5) are repeated and the current value is stabilized on the line extending from the linear charging characteristics (3) and (5). Incidentally, the value of applied voltage $E_0$ is kept the same in the continuous application and the intermittent application.

A current value $i_3$ at a time point $t_3$ after a constant time period T has elapsed since the start of voltage application, stays the same in both the continuous application and the intermittent application. That is, even when the direct current is intermittently applied, as long as the OFF time ($t_a$ through $t_b$ for example) in the intermittent application is a short time period (for example, several hundreds of milliseconds or shorter), a result similar to continuous charging by the continuous application is provided.

According to an experiment conducted by the inventors, in the case of a capacitor having a capacitance value of 0.01 $\mu$F. or higher, when the OFF time of intermittent application is set to 500 m seconds or shorter, a result similar to that in the continuous application is provided.

A study of the above-described charging characteristic reveals the following fact. That is, the equivalent circuit of the capacitor is constituted by a capacitance $C_0$, an equivalent series resistance r, an insulation resistance $R_0$ and a dielectric polarized component D as shown by FIG. 3. It has been revealed that the nonlinear charging characteristics (1), (2) and (4) in FIG. 1 and FIG. 2 are attributed to the charging region of the capacitance $C_0$ whereas the linear charging characteristics (3) and (5) are attributed to the charging region of the dielectric polarized component D.

Further, as mentioned above, when intermittent voltage application is performed, a result similar to that of continuous application is obtained and in this case, the charging rate of the capacitor remains unchanged.

Now, as a result of a further study on the intermittent application of direct current voltage to a capacitor, the inventors have found that a capacitor can be charged at a higher speed than in the case where direct current voltage is continuously applied, as long as certain conditions are satisfied. Based on these findings, the charging of a capacitor can be finished at a higher speed than in the case where the voltage is applied continuously, and the measurement of insulation resistance or determination of the quality or failure of the capacitor can be finished in a shorter period of time.

The present invention has been carried out based on the above-described knowledge and it is an advantage of the present invention to provide a method of charging a capacitor which is capable of charging at a high speed by intermittently applying direct current voltage to a capacitor.

SUMMARY OF THE INVENTION

In order to achieve the above-described object, according to the present invention, there is provided a method of charging a capacitor by intermittently applying a direct current voltage to a capacitor in which a voltage $E_1$ applied in an initial application is larger than a voltage $E_2$ applied in a succeeding application.

The inventors have obtained the results shown in FIG. 4 by charging the voltages applied in an intermittent application method. That is, in both the continuous application of FIG. 1 and the intermittent application of FIG. 2, a rated voltage $E_0$ is applied. However, according to FIG. 4, an initial applied voltage $E_1$ is made higher than the rated voltage, and an applied voltage $E_2$ at a second time is set to the rated voltage.

In FIG. 4, although the initial characteristic curves of voltage application (1) through (3) at the first time are substantially the same as those in FIG. 1 and FIG. 2, when the voltage is applied for the second time, the current value is increased firstly as shown by a curve (6) and thereafter, the current value is rapidly lowered and is stabilized to a linear charging characteristic (7). The current value of the linear characteristic (7) is lower than the linear characteristic (5) in FIG. 2. That is, the characteristic (7) is not disposed on the extension of the characteristic (3). Further, when voltage is applied for the third time (voltage=$E_2$), the current value is stabilized on the extension of the linear characteristic (7).

As described above, although the charging characteristics (1) through (3) obtained by the voltage application at a first time, are substantially the same as a charging characteristic obtained by applying a rated voltage, the charge current obtained by the voltage application $E_2$ at a second time is considerably less than the charge current obtained by the rated voltage. That is, the charging progresses more rapidly than in the continuous application. Accordingly, although a time period of $t_3$ is needed to reach the predetermined current value $i_3$ in the continuous application or the intermittent application in which the rated voltage is applied, in contrast, in the intermittent application where the applied voltage is changed as described above, the required time period is reduced to $t_4$. Thus, the charging time period can be shortened.

An investigation has been performed in respect of the ratio of the preceding applied voltage $E_1$ to the succeeding applied voltage $E_2$. It has been shown that a clear improvement is obtained when $E_1/E_2 \geq 1.2$. Particularly, when $E_1/E_2 \geq 2$, the charging progresses at a speed several times as much as in the case of $E_1=E_2$ by which the charging time period can significantly be shortened.

According to the present invention, there is provided the advantage that it is not necessary to stop operating a measuring device (for example, a turntable) for a long period of time as in the continuous application system. The insulation resistance can be measured while intermittently transferring capacitors. Accordingly, the equipment capacity can be improved.

Particularly, when a measuring device having a turntable is used, the charging region can be reduced and a number of terminals for measurement can be reduced.

Further, it has been found that a similar effect can be obtained even when a time period $T_1$ of applying the voltage $E_1$ is shortened, if the initial applied voltage $E_1$ is increased. That is, an effect similar to that described above can be obtained even when the application time $T_1$ of the initial applied voltage $E_1$ is made shorter than the application time period $T_2$ of the succeeding applied voltage $E_2$ whereby the charging time period can further be shortened. Such an effect is effective in the case of a batch system wherein a predetermined number of capacitors are supplied to a turntable, the turntable is stopped, and charging and measurement of insulation resistance are simultaneously carried out in respect of the plurality of capacitors. Thus, the processing capacity in such a system can be improved.

In this case, it is necessary for the initial application time period $T_1$ to be equal to or longer than a sum of the charging time period (1) and the transient time period (2) of the capacitor $C_0$ to meet the requirement of measuring capacitors in a short period of time, and it is preferable that the initial application time period $T_1$ be equal to or shorter than 100 milliseconds.

DETAILED DESCRIPTION OF EMBODIMENTS OF THE INVENTION

Figure 5:
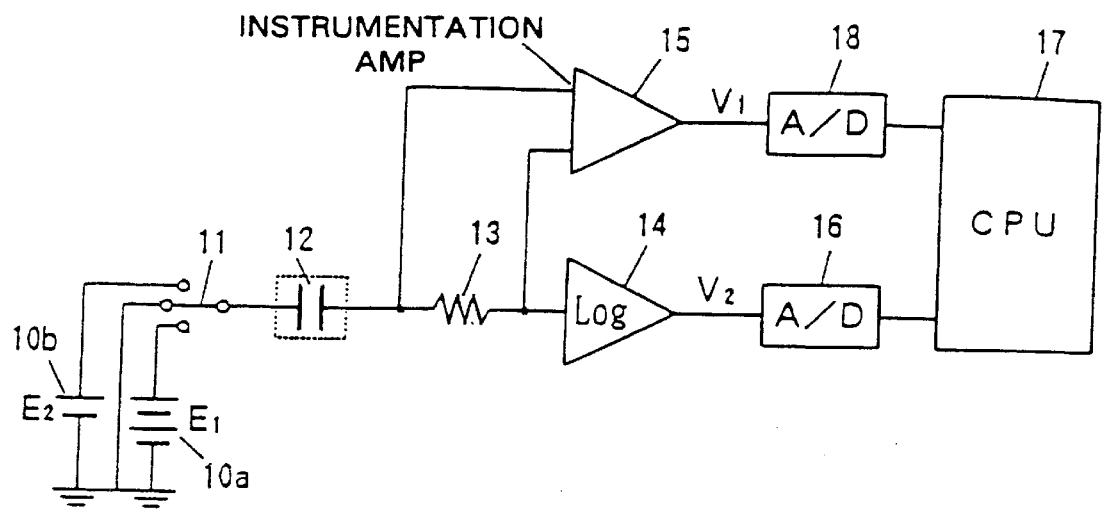
FIG. 5 is a circuit diagram of an example of a current measuring device.

FIG. 5 shows an example of a current measuring device for performing a method according to an embodiment of the present invention. The measuring device has been suggested by the applicant in Japanese Application No. 7-293442.

The measuring device is provided with direct current power sources 10a and 10b, a switch 11, a capacitor 12 that is an object for measurement, a current control resistor 13, a logarithmic amplifier 14, an instrumentation amplifier 15, A/D (Analog to Digital) converters 16 and 18 and a calculation processing circuit (CPU) 17. At the initial stage of charging, a current value is measured by the instrumentation amplifier 15 and the current is switched to the logarithmic amplifier 14 in accordance with a predetermined threshold and thereafter, measured by the logarithmic amplifier 14. The measuring device can accurately measure the charging current of the capacitor 12 even if the current is varied over a wide range of the width and therefore, the current value from the initial stage of charging to the final stage of charging which has been difficult to measure by a conventional measuring device can continuously be measured.

The switch 11 is switched by CPU 17 at predetermined time intervals by which a direct current voltage is intermittently applied to the capacitor 12 from either of the direct current measuring power sources 10a and 10b. A voltage $E_2$ of the power source 10b is set to a rated voltage (in this case, 25 volts) and a voltage $E_1$ of the power source 10a is set to be higher than the voltage $E_2$.

A time interval for making the switch 11 ON/OFF may not necessarily be constant. For example, the ON time at a second time may be longer than the ON time at a first time or the ON time at the first time may be longer than the ON time at the second time. Further, when the voltage is applied three times or more, the ON times at respective times may be changed. The respective intervals between ON times also may not be constant.

Incidentally, the method of the present invention does not need to use the measuring device of FIG. 5 but may use any other device as long as different voltages can be intermittently applied to the capacitor.

Figure 1:
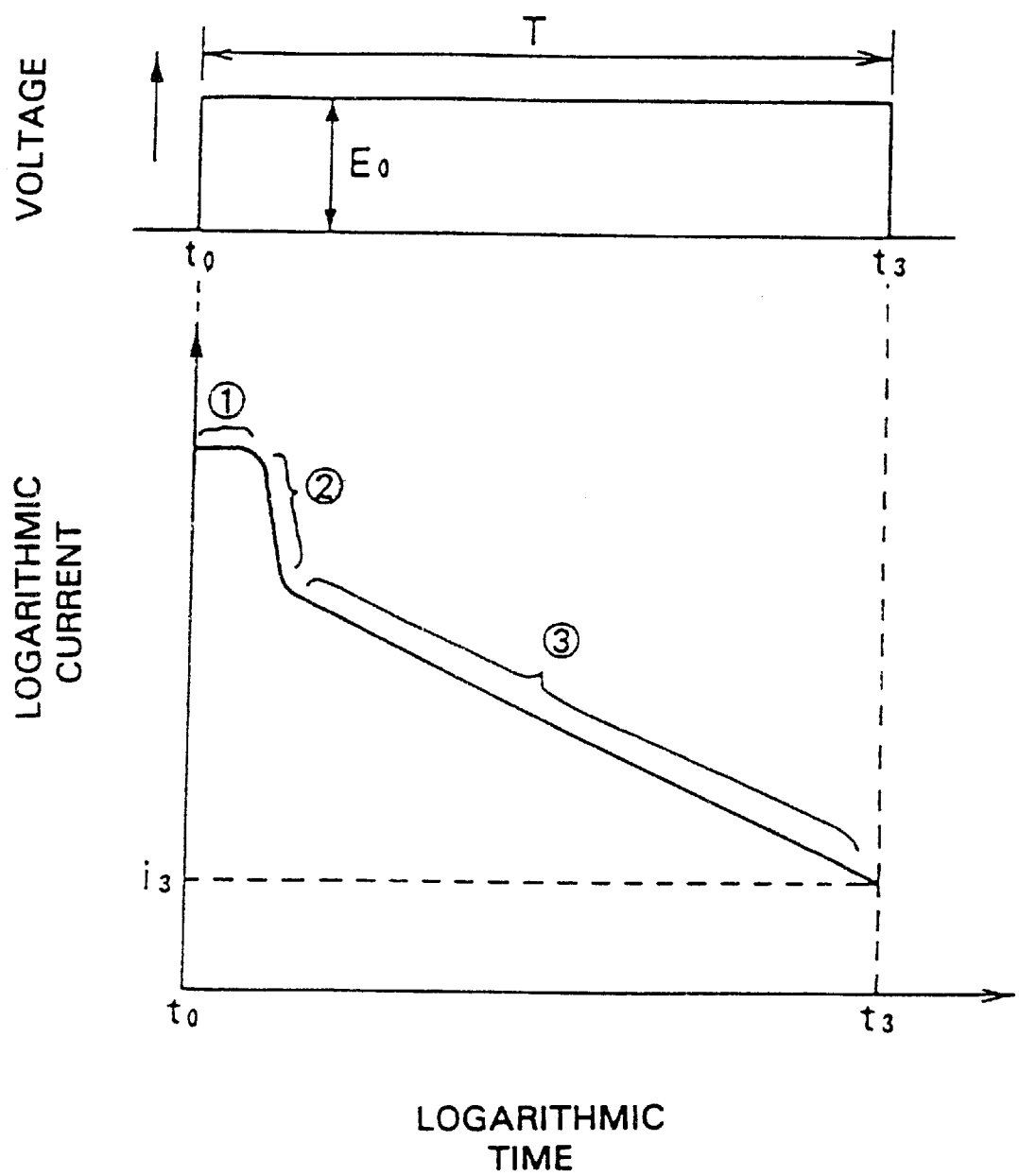
FIG. 1 is a charging characteristic diagram when direct current voltage is continuously applied to a capacitor.
Figure 2:
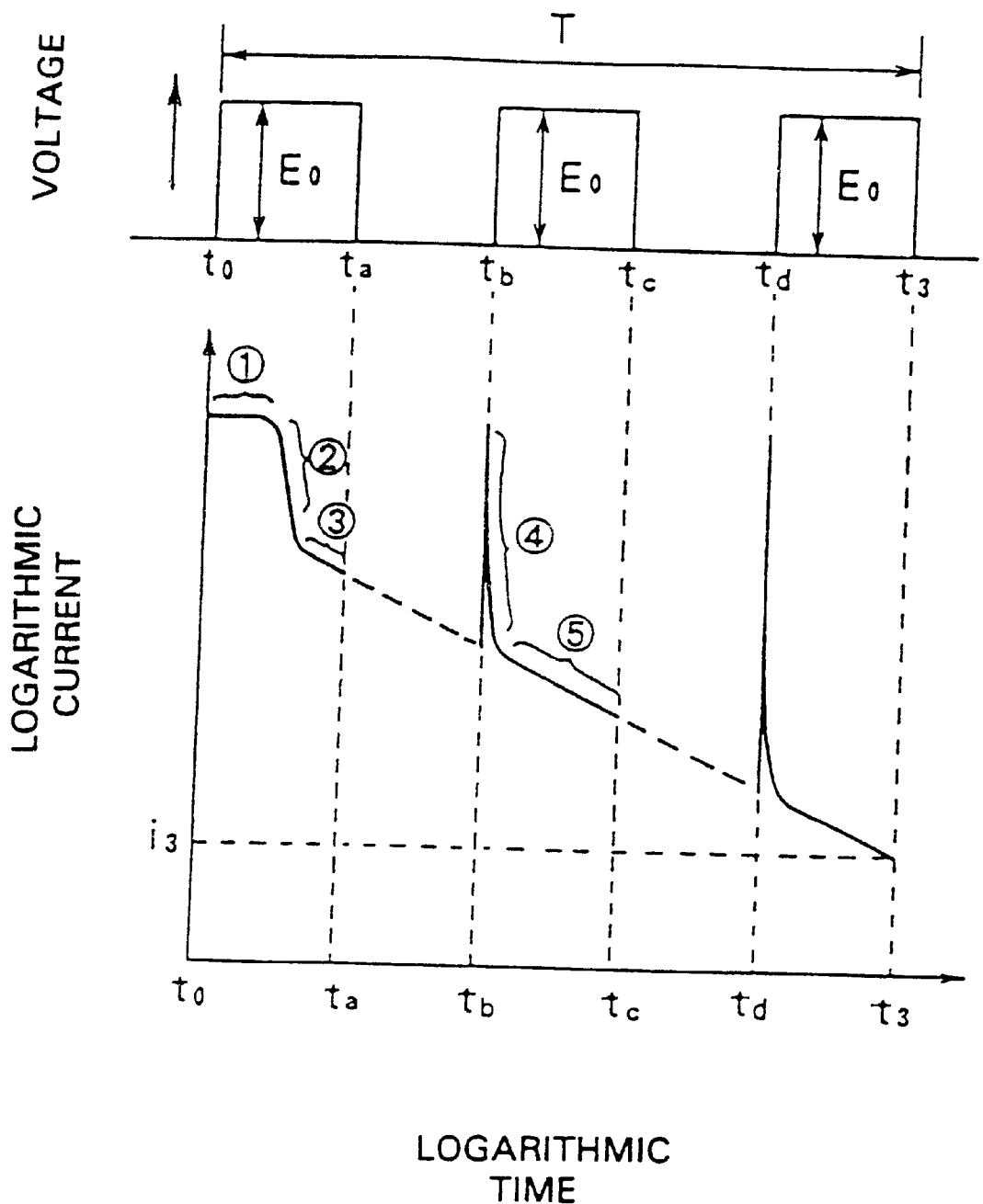
FIG. 2 is a charging characteristic diagram when direct current voltage is intermittently applied to a capacitor.
Figure 3:
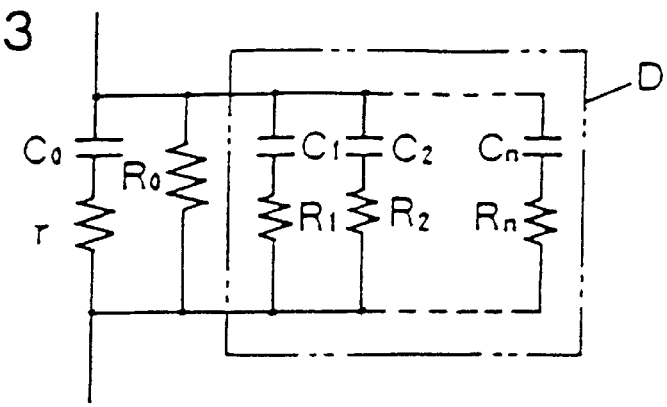
FIG. 3 is an equivalent circuit diagram of a capacitor.
Figure 4:
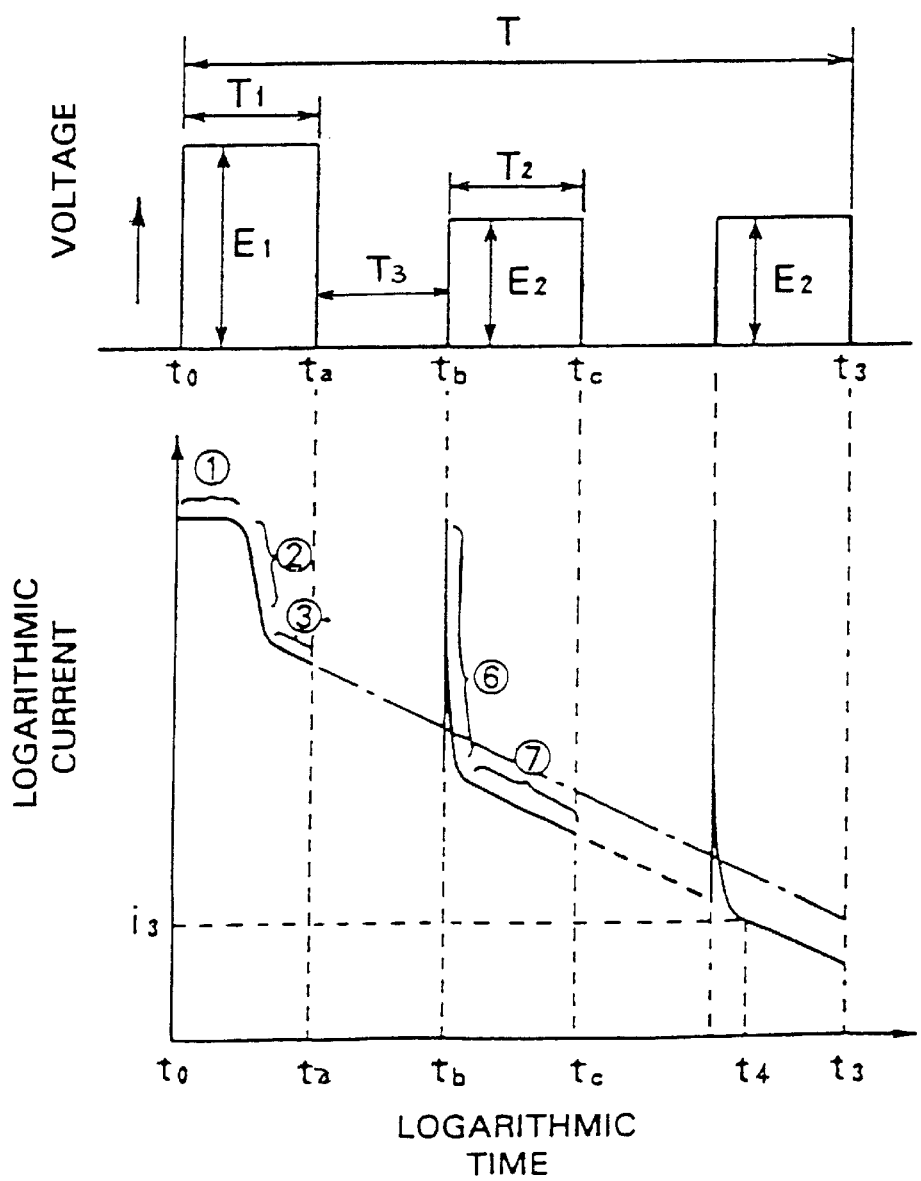
FIG. 4 is a charging characteristic diagram when direct current voltage is intermittently applied to a capacitor in accordance with the method according to an embodiment of the present invention.
Figure 6:
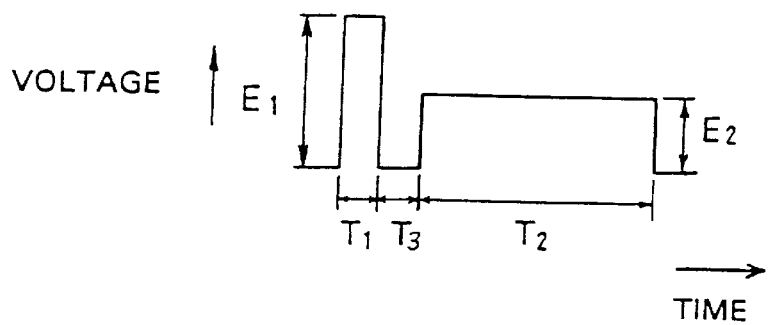
FIG. 6 is a diagram showing an example of an intermittent application method.
Figure 7:
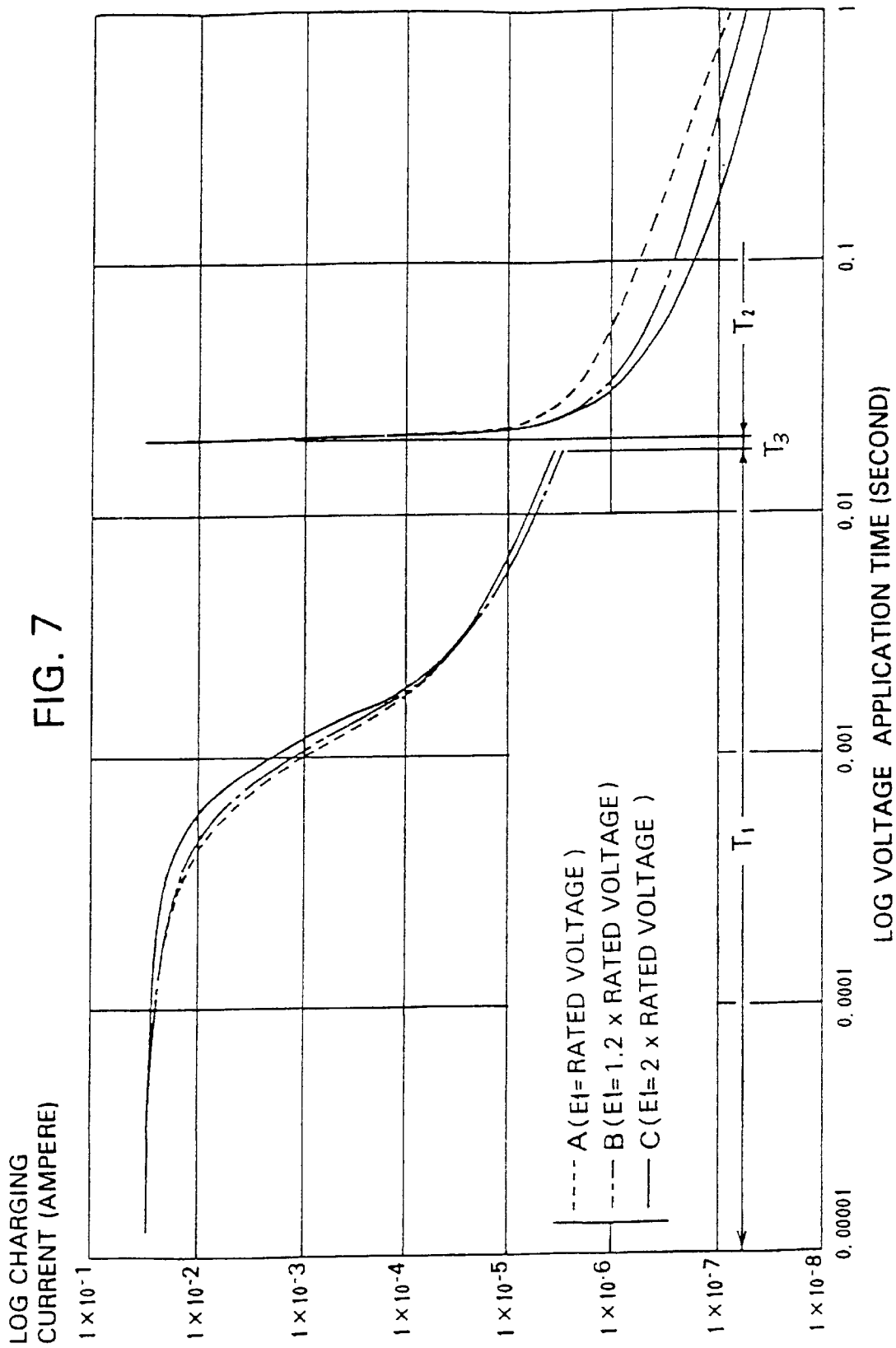
FIG. 7 is an actual charging characteristic diagram when the intermittent application of FIG. 6 is carried out.

Next, FIG. 7 shows charging characteristics in a case A where the rated voltage (25 volts) is intermittently applied twice as shown by FIG. 2 and cases B and C where different current voltages $E_1$ and $E_2$ are intermittently applied as shown by FIG. 6. In this case, a multi-layered ceramic capacitor is used for the capacitor and an initial charging current is set to 50 mA. Further, in experiments A through C, an application (ON) time period at a first time is set to $T_1$=20 m seconds, an open (OFF) time period is set to $T_3$=20 m seconds and an application (ON) time period at a second time is set to $T_2$=1 second and respective voltages are specified below.

TABLE 1

| Experimental example | A | B | C |
|---|---|---|---|
| 1st time (E1) | 25 V | 30 V | 50 V |
| 2nd time (E2) | 25 V | 25 V | 25 V |

As is apparent from FIG. 7, although the charging characteristic at the first voltage application stays substantially the same in either of the cases A through C, in the second voltage application, the charge current values are in a relationship of A>B>C and the charging progresses the fastest in case C. Also, in case B, the charging progresses faster than in case A. A time period required for lowering the charging current value to $1 \times 10^{-7}$A or lower is about 0.8 second in case A, about 0.4 second in case B and about 0.16 second in case C whereby it is seen that high speed charging has been performed in cases B and C compared with case A.

As a result of conducting a further experiment in the case of $E_1/E_2>2$, it has been shown that the charging rate is increased with an increase in $E_1/E_2$. Further, it has also been shown that when the applied voltages at the first time and the second time are made larger than the rated voltage, only a characteristic similar to that in FIG. 2 can be obtained as long as the applied voltages at the first time and the second time are set to the same voltage.

Further, it has been confirmed that a similar effect is obtained even if the first application time $T_1$ is made shorter than the second application time $T_2$. Therefore, the charging time can further be shortened. However, the time period $T_1$ is varied by the capacitance of the capacitor and a condition of an upper limit of $T_1$ must be established as follows:

Charge time period (1) of $C_0$+transient time period (2) of $C_0 \leq T_1$

Further, it is preferable that $T_1$ have the following upper limit value in order to measure the multi-layered ceramic capacitor in a short period of time:

$T_1 \leq 100$ ms

Further, the time period $T_2$ may be determined arbitrarily from the requested processing capacity of the object for measurement.

Figure 8:
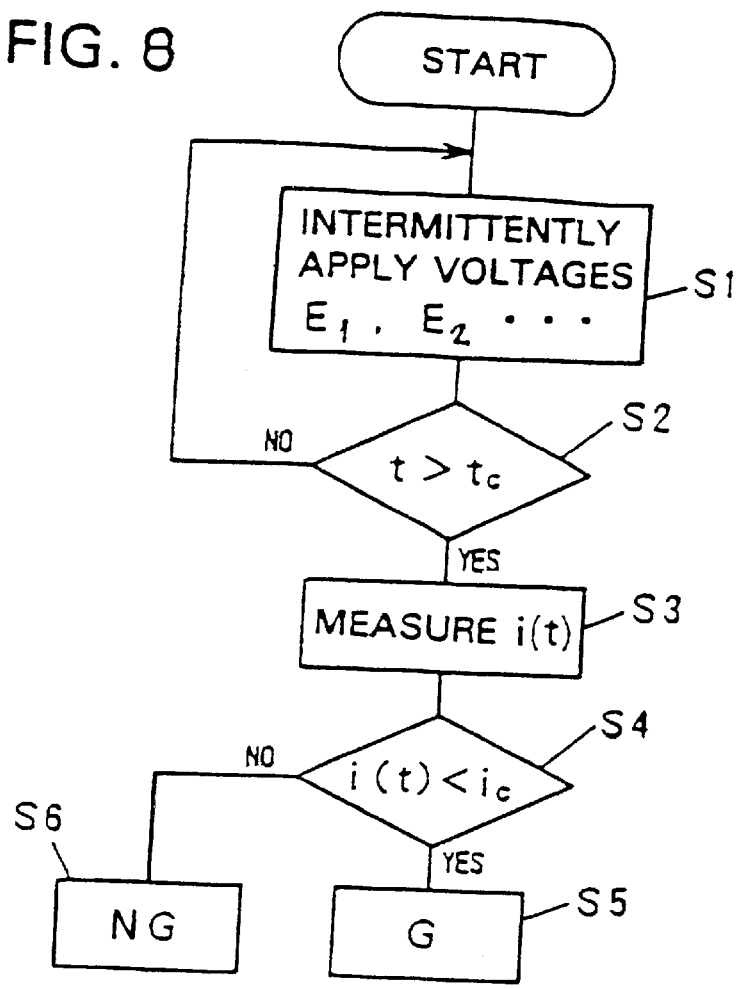
FIG. 8 is a flow chart of a method of determining the quality of a product using a charging method according to the present invention.

An explanation will be given of a method of determining quality or failure rate by using the method of the present invention in reference to FIG. 8.

First, the intermittent application using different voltages $E_1, E_2 \ldots$ is performed (step S1).

Next, it is determined whether a time period "t" elapsed from start of voltage application, has elapsed a predetermined time period $t_c$ (step S2). The time period $t_c$ is a reference time period where the charging current reaches a threshold $i_c$ by the intermittent application and the time period $t_c$ is set to, for example, about 1 to 10 seconds. When the predetermined time period $t_c$ has not elapsed, the intermittent application is repeated.

After the predetermined time period $t_c$ has elapsed, a current value i (t) is measured (step S3) and the current value i (t) is compared with the threshold $i_c$ for determining quality or failure (step S4).

When $i(t)<i_c$, it is determined that the object is an excellent product since the charging has sufficiently been progressed (step S5) and when $i(t) \geq i_c$, the object is determined to be a failed product since the charging has not been progressed sufficiently (step S6).

Incidentally, no limitation is imposed on whether the insulation resistance is measured after charging the capacitor in accordance with the method of the present invention, or whether quality or failure is determined, by comparing the current value after the capacitor has been charged for a predetermined time period with the threshold.

Figure 9:
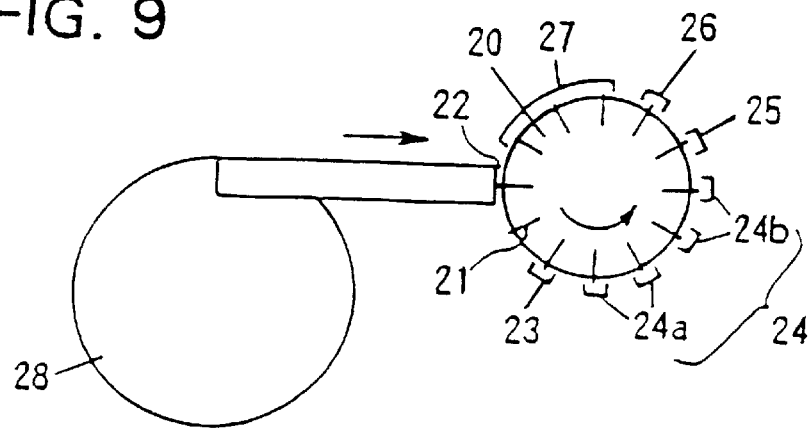
FIG. 9 is a plan view of an example of a characteristic measuring and selecting device using the method of the present invention.

FIG. 9 shows a specific example of a characteristic measuring and selecting device using the method of the present invention.

Numeral 20 designates a turntable and the turntable 20 is rotated intermittently pitch by pitch in the direction of the arrow. A plurality of holders 21 each capable of holding one chip-type capacitor that is an object of measurement are installed at equal pitch intervals at the periphery of the turntable 20. A supply unit 22 for supplying capacitors to the turntable 20, a capacitance measuring unit 23, a charging unit 24 for performing the present invention, an insulation resistance measuring unit 25 for measuring charging current, a discharge unit 26, a take-out unit 27 and the like are installed surrounding of the turntable 20 and a supply device 28 such as a parts feeder for feeding capacitors one by one to the turntable 20 is arranged at the supply unit 22.

The charge unit 24 is separated into a plurality of stages in which, for example, an applied voltage at an earlier half portion 24a is set to $E_1$ and an applied voltage at a later half portion 24b is set to $E_2$. Although in this case, a plurality of times of voltage application is performed for each of the portions 24a and 24b, the voltage application may be performed only once for each thereof.

Although in the conventional case, the charging region needs to be widened since a long period of time of charging must be performed in respect of capacitors on the turntable and therefore, the turntable per se is large-sized, when the method of the present invention is used, the charging region 24 need not be widened since the capacitors can be charged at a high speed and therefore, the turntable 20 can be downsized, the number of terminals for measurement can be reduced and cost reduction can be achieved. Further, a portion which has been the charging region can be used for other uses such as characteristic measurement or the like.

Further, the present invention is not limited to charging of a ceramic capacitor but can be used in charging other capacitors such as an electrolytic capacitor, a film capacitor and the like.

Further, various patterns are conceivable for patterns of voltage application according to the present invention. The number of times the preceding voltage application is applied $E_1$ and the number of times the succeeding voltage $E_2$ is applied are not limited to one but may be a plurality of times. For example, large and small voltage applications may be repeated a plurality of times, such as voltage application $E_1$ at a first time, voltage application $E_2$ at a second time ($E_2<E_1$), voltage application $E_1$ at a third time and voltage application $E_2$ at a fourth time. Or, a relationship among voltage application $E_1$ at a first time, voltage application $E_2$ at a second time and voltage application $E_3$ at a third time may be specified by $E_3<E_2<E_1$. In any case, the charging is accelerated by performing application of a small voltage after application of the large voltage and therefore, stages of application of a small voltage after application of a large voltage may preferably be included.

As is apparent from the above-described explanation, according to the present invention, a direct current voltage is intermittently applied to a capacitor such that the preceding applied voltage $E_1$ is made larger than the succeeding applied voltage $E_2$ and therefore, charging swiftly progresses during the open period and charging can be performed at a higher speed than when continuously applying the voltage. As a result, it is possible to finish measurement of insulation resistance and determination of quality or failure at a higher speed, thereby significantly promoting measurement capacity.

What is claimed is:

1. A method of charging a capacitor by intermittently applying a direct current voltage to the capacitor, comprising the steps of:

initially applying a voltage $E_1$ to the capacitor; and then applying a voltage $E_2$ to the capacitor, wherein $E_2$ is smaller than $E_1$.

2. The method of charging a capacitor according to claim 1, wherein the initial applied voltage $E_1$ is not less than 1.2 times as large as the succeeding applied voltage $E_2$.

3. The method of charging a capacitor according to claim 2:

wherein an application time period $T_1$ of the initial applied voltage $E_1$ is shorter than an application time period $T_2$ of the succeeding applied voltage $E_2$; and wherein the initial application time period $T_1$ is equal to or longer than a sum of a charging time period (1) of a capacitance $C_0$ of the capacitor, and a transient time period (2) of the capacitance $C_0$ of the capacitor, and equal to or shorter than 100 milliseconds.

4. The method of charging a capacitor according to claim 1:

wherein an application time period $T_1$ of the initial applied voltage $E_1$ is shorter than an application time period $T_2$ of the succeeding applied voltage $E_2$; and wherein the initial application time period $T_1$ is equal to or longer than a sum of a charging time period (1) of a capacitance $C_0$ of the capacitor, and a transient time period (2) of the capacitance $C_0$ of the capacitor, and equal to or shorter than 100 milliseconds.

5. The method of charging a capacitor according to claim 1, wherein $E_1$ is greater than a rated voltage of the capacitor and $E_2$ is substantially equal to the rated voltage of the capacitor.

* * * * *